US012805264B2

(12) United States Patent
Wipperling et al.

(10) Patent No.: US 12,805,264 B2
(45) Date of Patent: Nov. 17, 2026

(54) SUBSTRATE CARRIER BORE HOLE PLUG

(71) Applicant: SCHUNK XYCARB TECHNOLOGY B.V., Helmond (NL)

(72) Inventors: Moritz Wipperling, Helmond (NL); Aslan Andon, Helmond (NL); Andreas Vollmer, Helmond (NL); Henricus Josephus Maria De Cocq, Helmond (NL)

(73) Assignee: SCHUNK XYCARB TECHNOLOGY B.V., Helmond (NL)

( * ) Notice: Subject to any disclaimer, the term of this patent is extended or adjusted under 35 U.S.C. 154(b) by 371 days.

(21) Appl. No.: 18/689,741

(22) PCT Filed: Sep. 5, 2022

(86) PCT No.: PCT/NL2022/050498
§ 371 (c)(1),
(2) Date: Mar. 6, 2024

(87) PCT Pub. No.: WO2023/033650
PCT Pub. Date: Mar. 9, 2023

(65) Prior Publication Data

US 2024/0387236 A1 Nov. 21, 2024

(30) Foreign Application Priority Data

Sep. 6, 2021 (NL) ...................................... 2029133

(51) Int. Cl.
*H01L 21/687* (2006.01)
*H10P 72/76* (2026.01)

(52) U.S. Cl.
CPC ...... *H10P 72/7624* (2026.01); *H10P 72/7611* (2026.01); *H10P 72/7616* (2026.01); *H10P 72/7621* (2026.01)

(58) Field of Classification Search
CPC .............. H10P 72/7624; H10P 72/7611; H10P 72/7616; H10P 72/7621
See application file for complete search history.

(56) References Cited

U.S. PATENT DOCUMENTS 5,133,284 A 7/1992 Thomas et al.
5,238,499 A * 8/1993 van de Ven ....... C23C 16/45521 118/724

(Continued)

FOREIGN PATENT DOCUMENTS

EP 0698674 A2 2/1996
EP 0698674 A3 2/1996

(Continued)

OTHER PUBLICATIONS

Certificate of Correction to U.S. Pat. No. 5133284A dated Oct. 31, 1995.

(Continued)

*Primary Examiner* — Peniel M Gumedzoe
(74) *Attorney, Agent, or Firm* — Sulter Swantz IP

(57) ABSTRACT

The present invention relates generally to a substrate or wafer carrier for use in a system for depositing thin films. A substrate carrier for use in a system for growing epitaxial layers on semiconductor substrates is provided, said substrate carrier being a disk having a first surface side, comprising a plurality areas defined as substrate support areas arranged for accommodating, during use, said semiconductor substrates, and wherein said substrate carrier further comprises a plurality of gas channels, and wherein each of said gas channels consists of a bore hole arranged from a wall surface circumferential of the substrate carrier and provided with a bore hole plug. The bore hole plug comprises a first and a separate second part, wherein at least a section of said first part has a shape mating said bore hole for press fitting at least said section of said first part in said bore (Continued)

hole, and wherein said second part is provided with interlocking means. The interlocking means of said bore hole is provided in said wall surface of said substrate carrier at an angle with respect to the longitudinal direction of said bore hole, for blocking said first bore hole plug part.

17 Claims, 5 Drawing Sheets

(56) References Cited

U.S. PATENT DOCUMENTS

| | | | | | |
|---|---|---|---|---|---|
| 5,620,525 | A * | 4/1997 | van de Ven | C23C 16/45521 118/724 |
| 5,843,233 | A * | 12/1998 | van de Ven | C23C 16/45519 118/728 |
| 2006/0269390 | A1 | 11/2006 | Nakamura et al. | |
| 2014/0261698 | A1 | 9/2014 | Krishnan et al. | |
| 2017/0076972 | A1 | 3/2017 | Krishnan et al. | |

FOREIGN PATENT DOCUMENTS

| | | | |
|---|---|---|---|
| FR | 2566682 | A1 | 1/1986 |
| JP | H04233221 | A | 8/1992 |
| JP | H06283431 | A | 10/1994 |
| JP | H08181080 | A | 7/1996 |
| JP | 2013140918 | A | 7/2013 |
| NL | 8600059 | A | 8/1987 |
| WO | 08201482 | A | 5/1982 |
| WO | 2014132948 | A1 | 9/2014 |

OTHER PUBLICATIONS

PCT International Search Report dated Dec. 5, 2022; PCT/NL2022/050498.

Japanese Patent Office, Notice of Reasons for Refusal for Patent Application No. 2024-514594 dated Feb. 27, 2026, 6 pages (Translation only).

* cited by examiner

SUBSTRATE CARRIER BORE HOLE PLUG

TECHNICAL FIELD

The present invention relates generally to a substrate or wafer carrier for use in a system for depositing thin films by means of Chemical Vapor Deposition (CVD) or Atomic Layer Deposition (ALD) on a substrate for manufacturing semiconductor components. More specifically relates the present invention to a substrate carrier with plugs for one or more bore holes.

BACKGROUND OF THE INVENTION

A substrate carrier as is used in chemical vapor deposition (CVD) processes for manufacturing semiconductor components. In a CVD or in an Atomic Layer Deposition (ALD) process a stack of thin layers composed of materials such as for example aluminum oxide, aluminum nitride, or gallium nitride are grown or deposited on for example a silicon, gallium nitride, or sapphire semiconductor substrate (also known as a wafer or wafer substrate), which semiconductor substrate is accommodated in a recessed pocket present in the deposition surface of the substrate carrier.

Such circular substrate carrier may have one single recessed pocked but typically have multiple recessed pockets, each for accommodating a single semiconductor substrate in an ALD process chamber as for example disclosed in US2017309512A1. In citation the recessed pockets for the semiconductor substrates to be processed are evenly distributed across the first, deposition surface side of the substrate carrier. Such substrate carrier system is generally referred to as a pancake batch carrier system.

In the CVD or ALD process the overall deposition surface of the substrate carrier including the semiconductor substrates accommodated in the recessed pockets are subjected to the deposition gases leading to the deposition of semiconductor layers on the exposed surface sides of the semiconductor substrates, but also on the remaining exposed area part of the deposition surface side of the substrate carrier neighboring the pockets (and the substrates).

Known wafer carriers are arranged for providing gas channels to the bottom of the recessed wafer pockets. These channels or gas distribution channels can serve the purpose of supplying purge gas to the recessed pockets in which the wafer is positioned. In other designs these gas channels may service a different or additional purpose of providing a vacuum channel. In any of these designs the wafer carrier is thus to be provided with a channel which is arranged to provide a gas or vacuum connection between the pockets and a supply or discharge manifold of the system.

Such gas channels within the wafer carrier are machined into the carrier in typically a manufacturing process of several steps which comprise machining first vertical channel sections within each pockets in a plane perpendicular to the bottom of the pocket which accommodates the wafer. Further, radially inward of the pockets near the spindle, or carrier hub, further vertical channel sections are provided or machined to provide the inlet or outlet ports of the channels from or towards the pockets and the first vertical channel sections provided therein. The final section of the channel, the horizontal channel section which connects both first and second vertical sections, is machined in a horizontal plane parallel to the main surface of the wafer carrier. As such a deep drilled gas channel hole is provided which extends from the side wall of the wafer carrier, towards the first vertical channel section up until the second vertical channel section such that a gas or fluid connection is provided between these first and second channel sections and thus between the pockets and a inlet/outlet on the bottom part, in or near the center of the wafer carrier and thus radially inward of the pockets.

Since gas being provided through this channel may escape to and from the opening in the side wall of the wafer carrier, these need to be closed off after drilling the hole. Typically, these holes are provided with a hole plug which is pushed in the gas channel and dimensioned in such a way that it remains in position through a press fit application. In order to make sure that the plug does not provide a negative effect on the process parameters of the CVD or ALD process, the plug it at least pressed into the channel up until it does not stick-out beyond the side wall or contour of the wafer carrier.

It has been found, however, that these known plugs have disadvantages, amongst which, to do alter the CVD or ALD process parameters, and most importantly, they have the tendency to get loose prior to the proposed end-of-life of the wafer carrier, which in turn may also cause further damage to the CVD or ALD system.

As such, there is a need for an improved wafer carrier design with gas channels providing a gas connection between the pockets and a gas in/outlet in or near the center of the wafer carrier and thus radially inward of the pocket, More specifically, there is a need for an improved wafer carrier design with improved gas channel bore hole plugs by which at least some of the above mentioned problems are obviated.

SUMMARY

In accordance with a first aspect of the present disclosure, there is provided a substrate carrier for use in a system for growing epitaxial layers on semiconductor substrates, said substrate carrier being a disk having a first surface side, comprising a plurality areas defined as substrate supports arranged for accommodating, during use, said semiconductor substrates, and wherein said substrate carrier further comprises a plurality of gas channels, extending radially inward of said disk and each providing a gas connection between each of the substrate supports and a center portion of the disk radially inward of the substrate supports, and wherein each of said gas channels consists of a bore hole arranged from a wall surface circumferential of the substrate carrier and provided with a bore hole plug, characterized in that said bore hole plug comprises a first and a separate second part, wherein at least a section of said first part has a shape mating said bore hole for press fitting at least said section of said first part in said bore hole, and wherein said second part is provided with interlocking means, and each bore hole is provided with a means corresponding to and arranged for receiving and mechanically retaining said interlocking means of said second part, and wherein said interlocking means of said bore hole is provided in said wall surface of said substrate carrier at an angle with respect to the longitudinal direction of said bore hole, for blocking said first bore hole plug part.

Wafer carrier or substrate carriers are known to have long or deep bore holes which are machined or drilled into the carrier to obtain gas channels, which extend radially through the substrate carrier. Each of these gas channels provides a gas connection between each of the substrate supports, e.g. recessed wafer pockets and a center portion of the substrate carrier radially inward of the substrate supports.

These gas channels thus start at a hub location and end in the deepest, most inner part of the substrate supports, preferably close to or in the center of the substrate supports. The gas channel is arranged to provide purge gas and/or a vacuum channel. In some embodiments, more common to MOCVD planetary systems, gas pushed through these channels will elevate and, in case of pockets provided with a spiral shaped pattern, rotate the wafers or disks which hold the wafers in these pockets. Hence, in all aspects and all examples the substrate supports are to be interpreted as any type of support for substrates, wafers, sub-carriers, hence, including and not limited to substrate carriers having pockets for accommodating substrates, or having means like spiral shaped patterns for levitating sub-carriers in a planetary disk type of configuration. The skilled person will appreciate that the proposed disclosure is applicable on these and any other type of such disk shaped carriers.

These gas channels or holes are drilled from the outer diameter or circumferential wall surface of the substrate carrier and plugged with a bore hole plug.

It has been found, however, that known bore hole plugs, which are press fitted into the bore hole do provide a tight fit, due to the press fitting method and due to accurate dimensions of both the bore hole as the bore hole plug. However, over time, the bore hole plug may become loose, which will eventually result in failure of the substrate carrier when the plug will fall out or cause gas leakage which influences the process parameters of the CVD, ALD, or MOCVD process in a negative manner.

The bore hole plug according to the present disclosure consists of two parts, one having close similarities to the known bore hole plugs, and being arranged for press fitting this part into the bore hole to ensure a gas-tight closure of the bore hole, whereas a second part is provided as an interlocking means, e.g. in the form of a blocking or stopping element to permanently lock the first part into position. The second bore hole plug part is a separate part and contrary to the first part preferably not arranged for solely press fitting but comprises an interlocking mechanism, like for example a bayonet, or threaded portion which can be received by a pocket in the bore hole of the substrate carrier having a corresponding interlocking means. Since the blocking or stopping element is provided at an inclination angle with respect the bore hole and thus the first bore hole plug part, it will ensure that the first bore hole plug part will not fall out of the wafer carrier, or even come loose in such a way that gas leakage can occur.

The use of the second bore hole plug part has several advantages. For example, with respect to redesigning known press fit bore hole plugs, the press fitting of at least a part of the bore hole plug is maintained as on the one hand this will ensure gas tight closing of the bore hole, where on the other hand, failure due to coming loose or falling out is prevented by the second bore hole plug part. Also, the second bore hole plug part is at least mostly placed in the corresponding bore hole in a direction which is not in-line or the forces acting upon the bore hole plug due to the gas pressure in the channel and the first bore hole plug part press-fitted into the bore. As the second part is at an angle with the first part, it is able to withstand more pressure than a single part or two (separate) parts which are placed in-line with the bore hole. Moreover, the proposed bore hole plug only requires some additional machining steps for which no additional equipment or tools are required besides those that are already required for machining the original bore hole and known bore hole plugs. Further, the bore hole and thus gas channel do not require modification thus not affecting the process parameters of the CVD, ALD or MOCVD process. Finally, the proposed bore hole plug is also arranged for post-processing at least the second bore hole plug part to make sure the bore hole plug is flush with the wall surface of the substrate carrier.

In an example, the wall surface of said substrate carrier is sloped towards a second surface side of said substrate carrier opposite said first surface side.

In an example, said thread of said bore hole is provided in said substrate carrier after at least said section of said first part is press fitted in said bore hole.

In an example, said second part of said bore hole plug is, in after being provided in the bore hole, in contact with the first part of said bore hole plug.

In an example, said second part of the bore hole plug has a head section for receiving a tool for screwing said threaded section into said thread of said bore hole.

In an example, said head section for receiving said tool comprises a polygon shaped tool receiving section extending from said head section, and wherein said tool receiving section preferably is arranged, after being provided in thread of the bore, to extend said wall surface of said substrate carrier.

In an example, said interlocking means comprise one or more of a threaded fastening means, screw fastening means, press-fit fastening means, rotational fastening means, bayonet mount fastening means, key or pin fastening means and shrink-fit fastening means.

In an example, said angle of said interlocking means of said bore hole with respect to the longitudinal direction of said bore hole is approximately one or more of 30 degrees, 45 degrees, 60 degrees, 90 degrees, 120 degrees, 135 degrees or 150 degrees.

In an example, said substrate carrier is comprised of graphite.

In an example, said substrate carrier is comprises of a graphite core covered by a silicon carbide coating.

In an example, one or both of said first and second bore hole plug parts is comprised of graphite.

In a second aspect of the present disclosure, there is provided a method of manufacturing a substrate carrier for use in a system for depositing layers on semiconductor substrates, comprising the steps of:

- providing a substrate carrier having a first surface side, an area part of said first surface side being provided with recessed wafer pockets for accommodating, during use, said semiconductor substrates,
- machining a first bore hole section in each of said wafer pockets at least substantially perpendicular to the first surface side of the substrate carrier;
- machining a second bore hole section from a wall surface circumferential of the substrate carrier extending radially through said substrate carrier for providing a gas connection between each of the first bore hole sections in the recessed wafer pockets and a center portion of the substrate carrier radially inward of the recessed wafer pockets;
- press fitting a first bore hole plug part into the second bore hole section;
- machining a pocket for a second bore hole plug part into the wall surface of the substrate carrier, wherein said pocket is provided with a thread and arranged at an angle with respect to the longitudinal direction of the bore hole;

screwing in a second bore hole plug part which is at least partially provided with a threaded section corresponding to said thread of said pocket, for blocking said first bore hole plug part.

In an example, said method further, prior to said step of press fitting said first bore hole plug part, comprises the step of:

machining a chamfer on said wall surface of said substrate carrier.

In an example, said second bore hole plug part comprises a polygon shaped tool receiving section extending from said head section and wherein said method further, after said step of screwing in said second bore hole plug part, comprises the step of:

machining said wall surface of said substrate carrier by removing said tool receiving section extending from said wall surface of said substrate carrier for making said second bore hole plug part flush with said wall surface of said substrate carrier.

In an example, said method further, after said step of screwing in said second bore hole plug part, comprises the step of:

providing a coating of silicon carbide of at least said wall surface of said substrate carrier, and more in particular over covering all of said substrate carrier.

In an example, one or both of said first and second bore hole plug parts is comprised of graphite.

The invention will now be described in more detail by means of specific embodiments, with reference to the enclosed drawings, wherein equal or like parts and/or components are designated by the same reference numerals. The invention is in no manner whatsoever limited to the embodiments disclosed.

DETAILED DESCRIPTION

Figure 1:
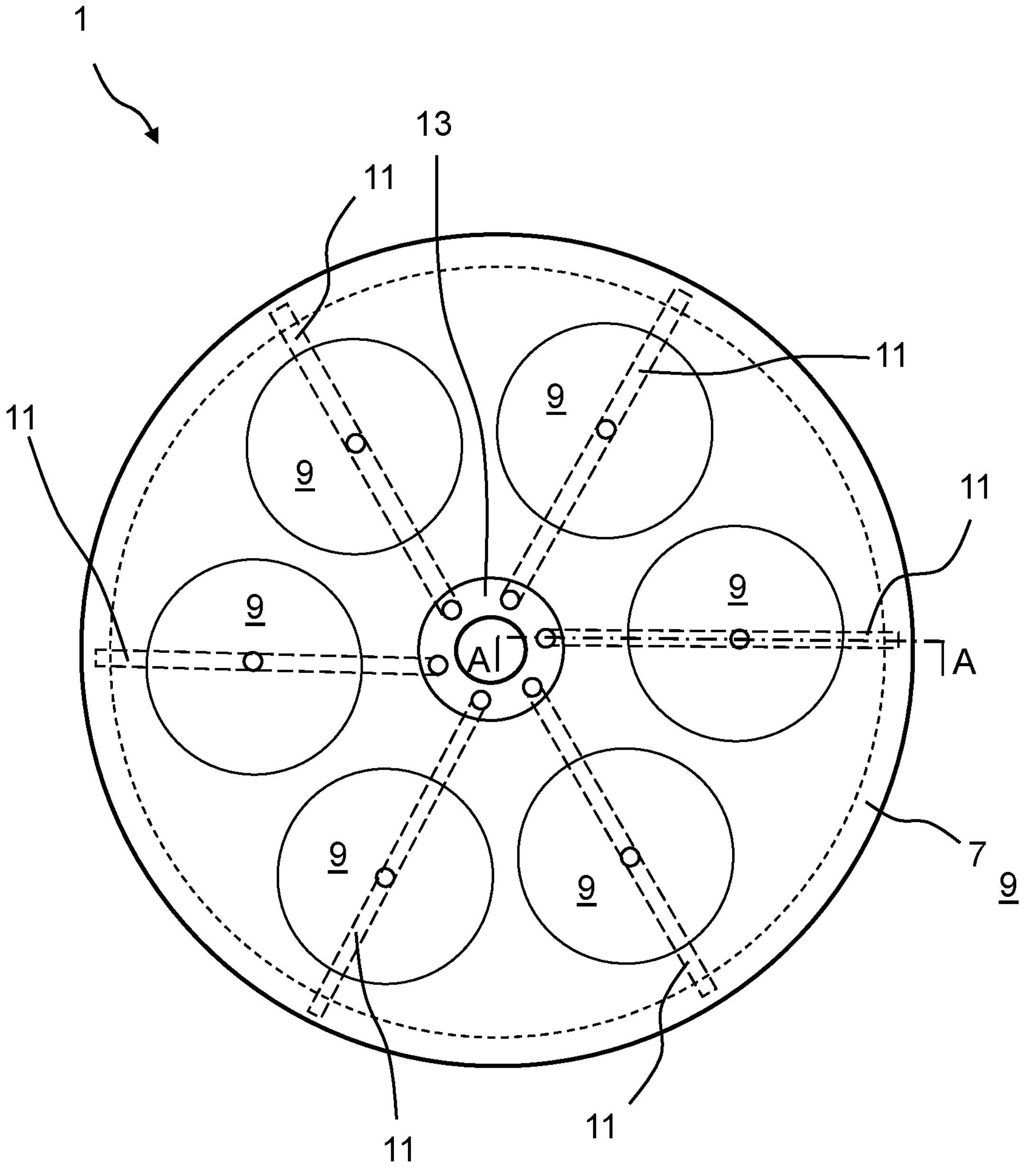
FIG. 1 shows schematically a top view of elements of a substrate carrier according to the first aspect of the present disclosure.
Figure 2:
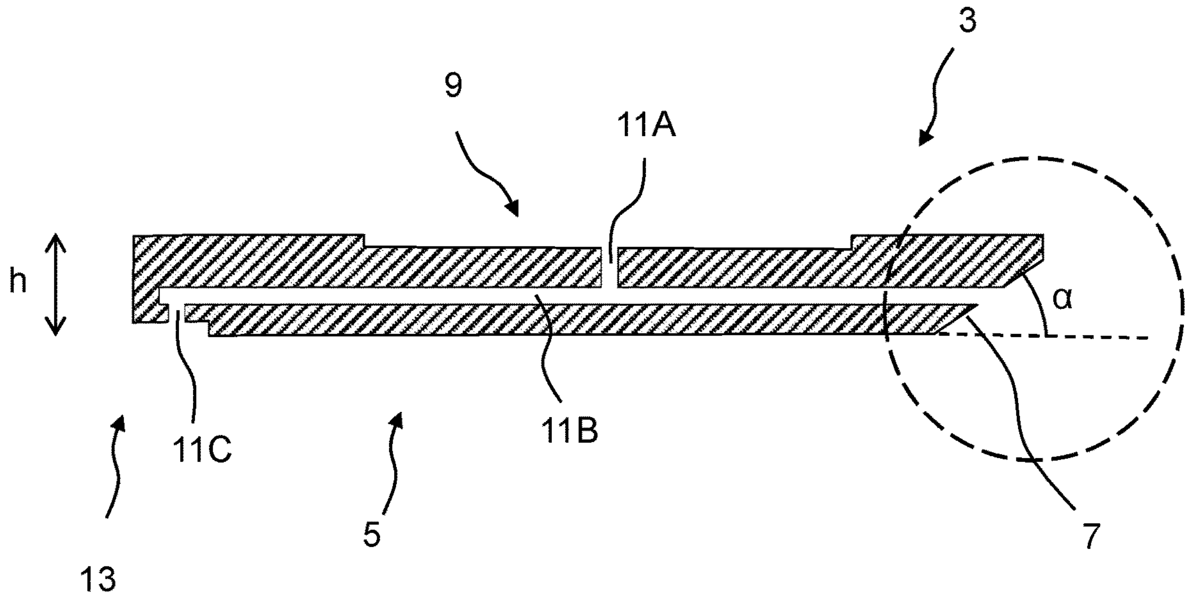
FIG. 2 shows a cross-sectional side view of the cross section A-A of FIG. 1.
Figure 3:
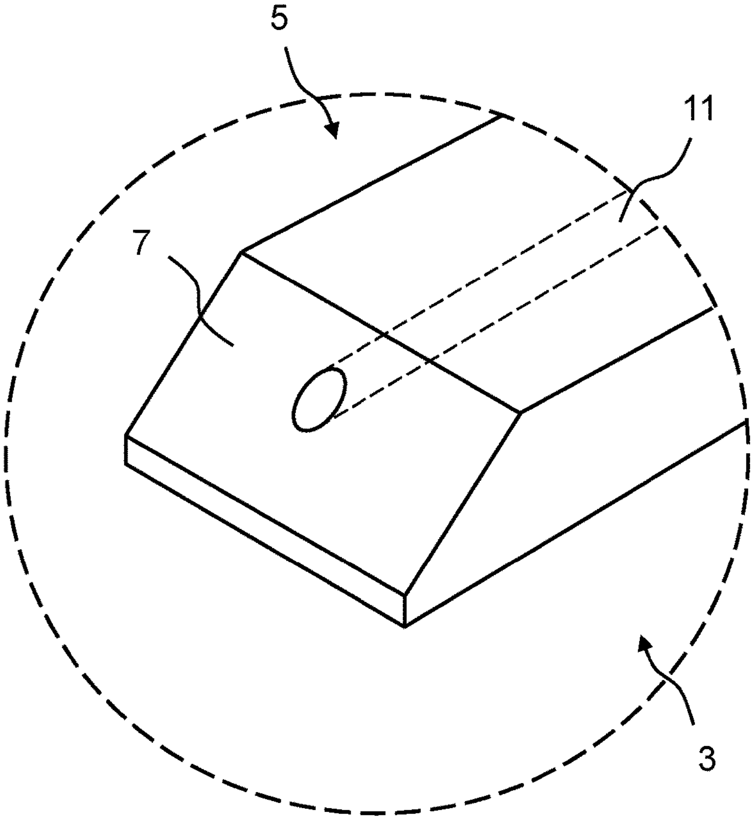
FIG. 3 shows in more detail an isometric view of the encircled section of FIG. 2.

FIG. 1 shows schematically a top view of a substrate carrier 1 for use in a system for growing epitaxial layers on semiconductor substrates. FIG. 2 shows the cross-sectional view of cross section indicated by A-A in FIG. 1, wherein the encircled section in FIG. 2 is shown in more detail by the isometric view of FIG. 3. The substrate carrier 1 is a substrate carrier or (planetary) disk comprised of graphite, having a first surface side 3 and a second surface side 5. The first surface side 3 is the top side as shown in FIG. 1. The second surface side 5 is located opposite to the first surface side 3. The wall surface 7 circumferential of the substrate carrier 1 is sloped towards the second surface 5, at an angle α relative to the plane parallel to the first surface side 3 and the second surface side 5 of the substrate carrier 1. Notice that in FIGS. 3-7, for illustrative purpose, the first surface side 3 and the second surface side 5 are flipped relative to FIG. 1 and FIG. 2. In the embodiment shown in the FIG. 1, the substrate carrier 1 comprises six areas 9, which are defined as substrate supports arranged for accommodating, during use, the semiconductor substrates.

The substrate carrier 1 further comprises six internal gas channels 11. The gas channels 11 extending radially inward of the planetary disk. Each gas channel 11 provides a gas connection between each of the substrate supports 9 and a center portion 13 of the planetary disk radially inward of the substrate supports 9. Each of the gas channels 11 comprises a first bore hole section 11A, a second bore hole section 11B, and a third bore hole section 11C. From each substrate supports 9, the first section 11A extends perpendicular to the first surface side 3 of the substrate carrier 1, inwards the substrate carrier 1, approximately up to half of the height h of the substrate carrier 1. From the center portion 13, the third section 11C extends perpendicular to the second surface 5 of the substrate carrier 1, inwards the substrate carrier 1, approximately up to half of the height h of the substrate carrier 1. The second section 11B of the gas channel 11 consists of a circularly bore hole arranged from the wall surface 7 extending radially inward the substrate carrier 1, thereby fluidly connecting the first section 11A and the third section 11C of each gas channel 11.

In order to close and seal the opening of the gas channels 11 in the wall surface 7 of the substrate carrier 1, the substrate carrier 1 is provided with a bore hole plug. The bore hole plug comprises a first part 15 and a separate second part 17, both comprised of graphite. The first part 15 has a shape mating the bore hole of the gas channel 11 for press fitting the first part 15 in the bore hole. The first part 15 is inserted in its longitudinal direction into the gas channel 11, such that the opening of the specific gas channel 11 in the wall surface of the substrate carrier 1 is closed and sealed. Due to the pressure of the gas present in the gas channel 11, when the substrate carrier is in use, the pressed fitted first part 15 of the bore hole plug can be pushed out of the gas channel 11. To prevent this, the bore hole plug is provided with a second part 17.

The second part 17 of the bore hole plug comprises a circular shaped top section 19 and a circular shaped interlocking section 21, wherein the diameter of the interlocking section 21 is smaller than the diameter of the top section 19. The interlocking section 21 is provided with an interlocking feature, preferably a screw thread. The top section 19 is provided with a polygon shaped head section 23 for receiving an appropriate polygon shaped tool.

For interlocking the second part 17 of the bore hole plug to the substrate carrier 1, the substrate carrier 1 is provided with a pocket 25. The pocket 25 is machined into the substrate carrier 1, wherein pocket 25 extends perpendicular to the sloped wall section 7 inwards the substrate carrier 1. The depth and the diameters of the pocket 25 correspond to the length and the diameters of the respective top section 19 and the respective interlocking section 21 of the second part 17 of the bore hole plug.

Figure 4:
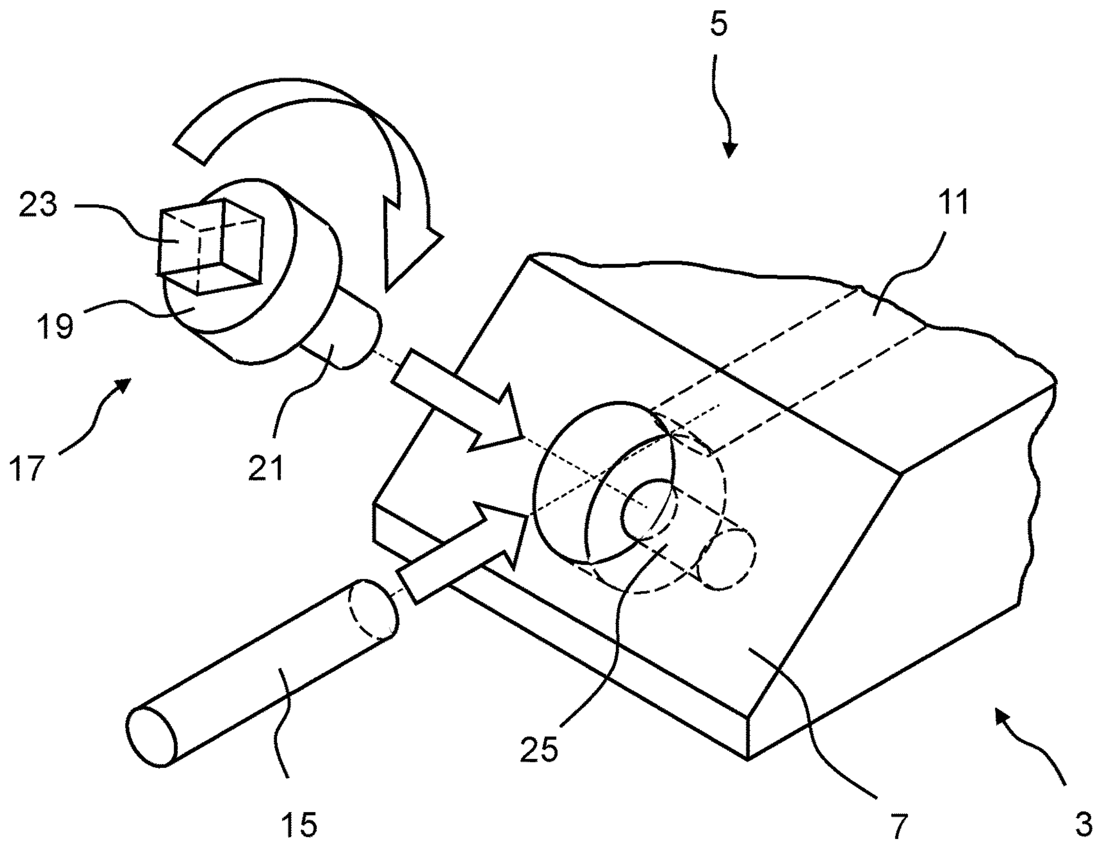
FIG. 4 shows schematically an isometric view of a section of a substrate carrier and a bore hole plug according to the first aspect of the present disclosure.
Figure 5:
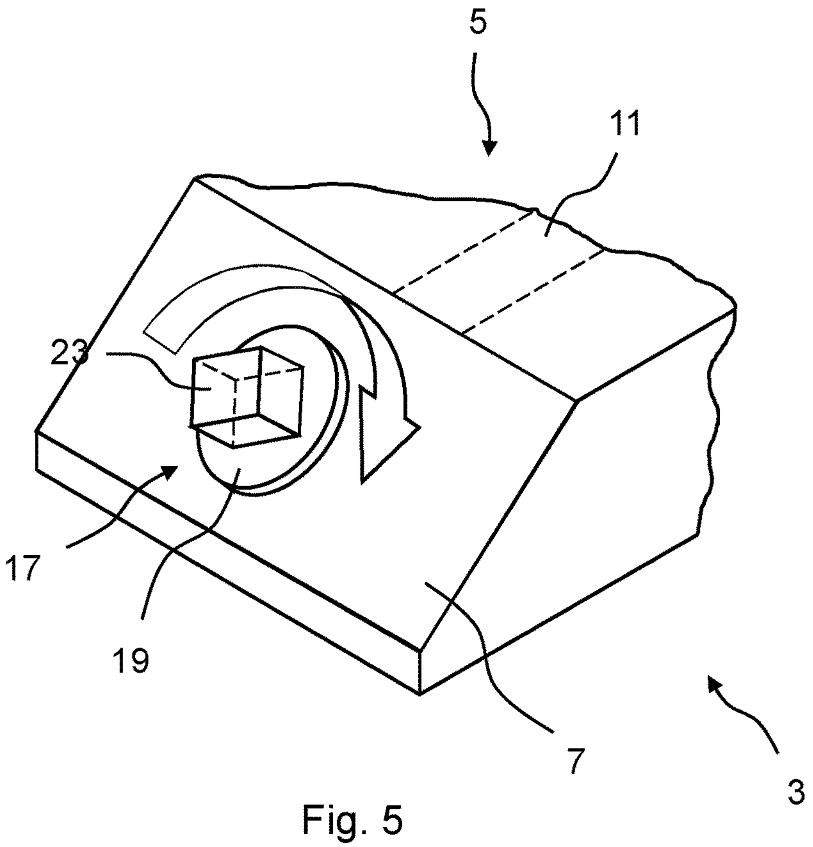
FIG. 5 shows schematically an isometric view of the section of FIG. 4 wherein the bore plugged is attached to the substrate carrier.
Figure 6:
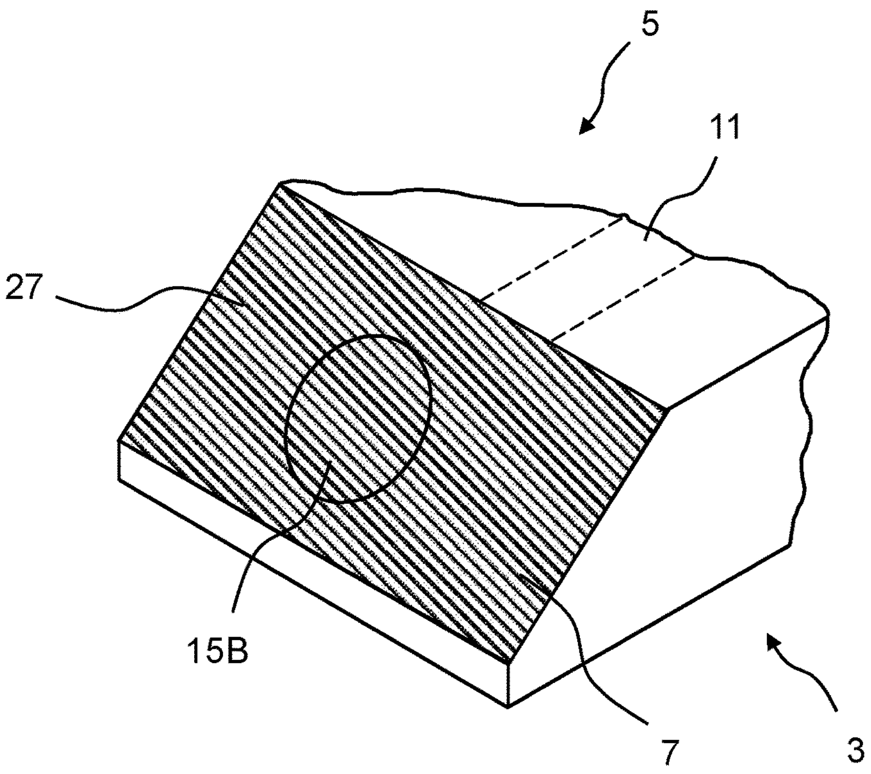
FIG. 6 shows schematically an isometric view of a coated section of substrate carrier according to the first aspect of the present disclosure.
Figure 7:
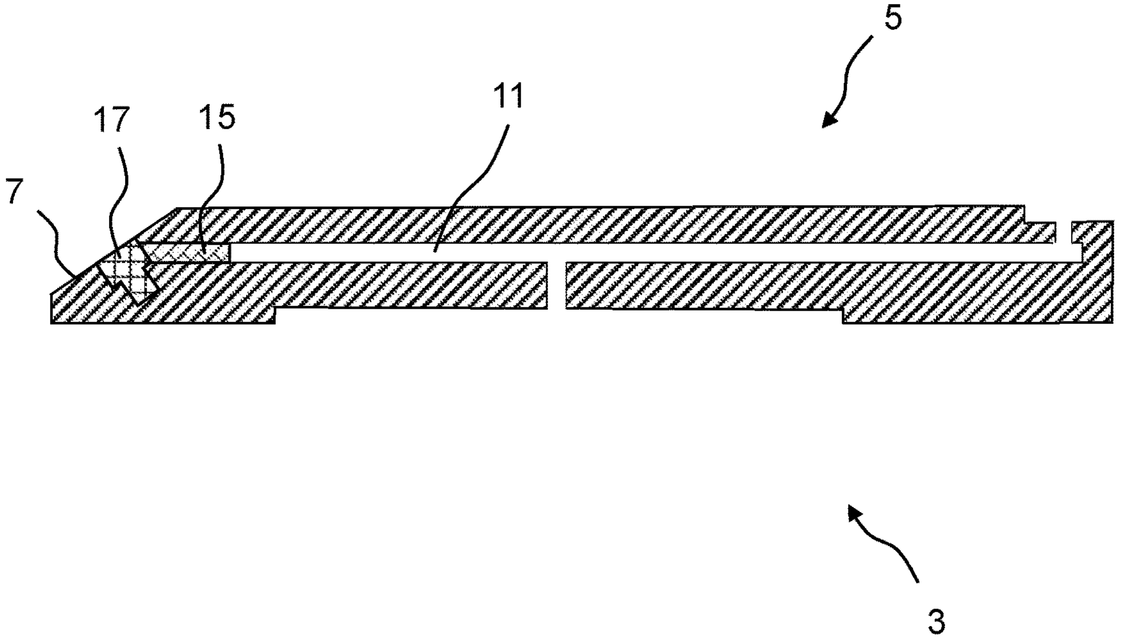
FIG. 7 shows schematically a cross-sectional view of the coated section of FIG. 6.

The section of the pocket 25 corresponding to the interlocking section 21 of the second part 17 of the bore hole plug is provided with means corresponding to and arranged for receiving and mechanically retaining the interlocking section 21 of the second part 17 of the bore hole plug. Preferably, the means comprise a thread corresponding to the screw thread of the interlocking section 21 of the second part 17 of the bore hole plug. With the use of the appropriate polygon shaped tool, the second part 17 of the bore hole plug is screwed into the thread of the pocket 25, by rotating the second part 17 of the bore hole plug clockwise relative to its central axis, as indicated in FIGS. 4 and 5.

Preferably, the pocket 25 is provided into the substrate carrier 1 after the first part 15 of the bore hole plug is press fitted in the bore hole of the gas channel 11, such that the second part 17 of the bore hole plug is, in after being provided in the pocket 25, in corresponding contact with the first part 15 of the bore hole plug and thereby blocking the first part 15 of the bore hole plug for exiting the respective gas channel 11. When the second part 17 of the bore plug is firmly provided into the pocket 25, the section of the second part 17 of the bore plug that protrudes the sloped wall section 7 is removed, after which the substrate carrier 1 is coated by a silicon carbide coating 27. The result is an invisible plug location firmly fixed into the gas channel 11, that cannot be pushed out of its position.

Figure 8:
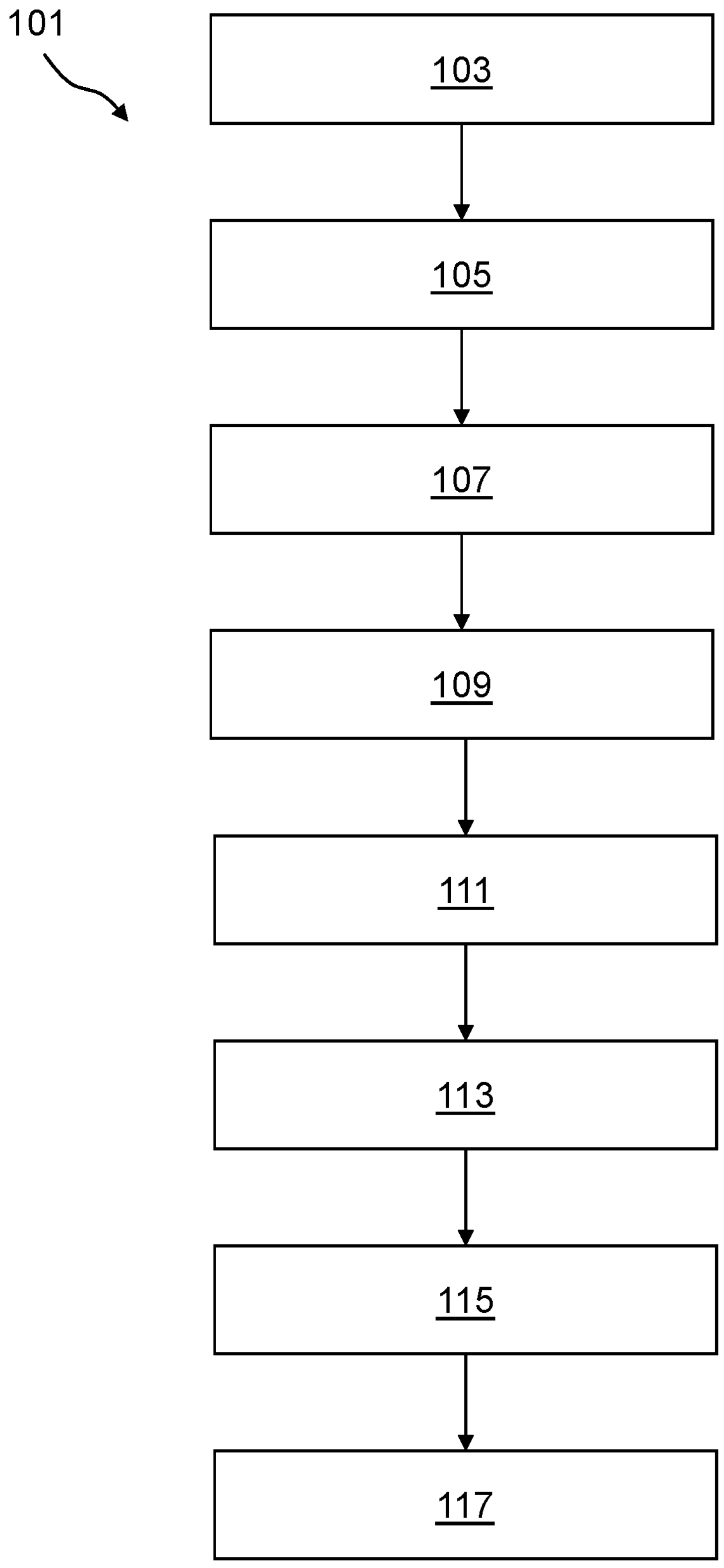
FIG. 8 shows an overview of a method of manufacturing a substrate carrier according to the second aspect of the present disclosure.

FIG. 8 shows a method 101 of manufacturing the substrate carrier 1 for use in a system for growing epitaxial layers on semiconductor substrates by chemical vapor deposition. In a first step 103 of the method 1, the substrate carrier 1 is provided. The area part 9 of the first surface side 3 of the substrate carrier 1 is provided with substrate supports for accommodating, during use, the semiconductor substrates.

In a second step 105 of the method 101, the first bore hole section 11A is machined in each of the substrate supports at least substantially perpendicular to the first surface side of the substrate carrier.

In a third step 107 of the method 101, the second bore hole section 11B is machined from the wall surface 7 circumferential of the substrate carrier 1 extending radially through the substrate carrier 1 for providing the gas connection between each of the first bore hole sections 11A in the substrate supports and the center portion 13 of the substrate carrier 1 radially inward of the substrate supports.

Additionally, a chamfer is machined on the wall surface 7 of the substrate carrier 1 during a fourth step 109 of the method 101.

In a fifth step 111 of the method 101, the first bore hole plug part 15 is press fitted into the second bore hole section 11B.

After the first bore hole plug 15 is press fitted into the second bore hole section, the pocket 25 for the second bore hole plug part 17 is machined into the wall surface 7 of the substrate carrier 1 during a fifth step 113 of the method 101, wherein the pocket 25 is provided with a thread and arranged at an angle with respect to the longitudinal direction of the bore hole.

During a sixth step 113 of the method 101, the second bore hole plug part 17, which is at least partially provided with a threaded section corresponding to the thread of the pocket 25, is screwed in the pocket 25, for blocking the first bore hole plug part 15.

Eventually, the substrate carrier 1 is finished, by machining the wall surface 7 of the substrate carrier 1 by removing the tool receiving section 23 extending from the wall surface 7 of the substrate carrier 1 for making the second bore hole plug part 17 flush with the wall surface 7 of the substrate carrier 1 during a seventh step 115 of the method 101.

In a last step 117 of the method 101, the substrate carrier 1 is provided with a coating of silicon carbide.

Based on the above description, a skilled person my provide modifications and additions to the method and arrangement disclosed, which modifications and additions are all comprised by the scope of the appended claims.

The invention claimed is:

1. A substrate carrier for use in a system for growing epitaxial layers on semiconductor substrates, said substrate carrier being a disk having a first surface side, comprising a plurality areas defined as substrate supports arranged for accommodating, during use, said semiconductor substrates, and wherein said substrate carrier further comprises a plurality of gas channels, extending radially inward of said disk and each providing a gas connection between each of the substrate supports and a center portion of the disk radially inward of the substrate supports, and wherein each of said gas channels consists of a bore hole arranged from a wall surface circumferential of the substrate carrier and provided with a bore hole plug, characterized in that said bore hole plug comprises a first and a separate second part, wherein at least a section of said first part has a shape mating said bore hole for press fitting at least said section of said first part in said bore hole, and wherein said second part is provided with interlocking means, and each bore hole is provided with a means corresponding to and arranged for receiving and mechanically retaining said interlocking means of said second part, and wherein said interlocking means of said bore hole is provided in said wall surface of said substrate carrier at an angle with respect to a longitudinal direction of said bore hole, for blocking said first bore hole plug part.

2. The substrate carrier according to claim 1, wherein the wall surface of said substrate carrier is sloped towards a second surface side of said substrate carrier opposite said first surface side.

3. The substrate carrier according to claim 1, wherein a thread of said bore hole is provided in said substrate carrier after at least said section of said first part is press fitted in said bore hole.

4. The substrate carrier according to claim 1, wherein said second part of said bore hole plug is, in after being provided in the bore hole, in contact with the first part of said bore hole plug.

5. The substrate carrier according to claim 1, wherein said second part of the bore hole plug has a head section for receiving a tool for screwing or otherwise rotationally interlocking said section into a thread of said bore hole.

6. The substrate carrier according to claim 5, wherein said head section for receiving said tool comprises a polygon shaped tool receiving section extending from said head section, and wherein said tool receiving section preferably is arranged, after being provided in thread of the bore, to extend said wall surface of said substrate carrier.

7. The substrate carrier according to claim 1, wherein said interlocking means comprise one or more of a threaded fastening means, screw fastening means, press-fit fastening means, rotational fastening means, bayonet mount fastening means, key or pin fastening means and shrink-fit fastening means.

8. The substrate carrier according to claim 1, wherein said angle of said interlocking means of said bore hole with respect to the longitudinal direction of said bore hole is approximately one or more of 30 degrees, 45 degrees, 60 degrees, 90 degrees, 120 degrees, 135 degrees or 150 degrees.

9. The substrate carrier according to claim 1, wherein said substrate carrier is comprised of graphite.

10. The substrate carrier according to claim 9, wherein said substrate carrier is comprises of a graphite core covered by a silicon carbide coating.

11. The substrate carrier according to claim 1, wherein said first bore hole plug part is comprised of a graphite.

12. The substrate carrier according to claim 1, wherein said second bore hole plug part is comprised of a graphite.

13. A method of manufacturing a substrate carrier for use in a system for growing thin film layers on semiconductor substrates by chemical vapor deposition, comprising the steps of:

providing a substrate carrier having a first surface side, an area part of said first surface side being provided with substrate supports for accommodating, during use, said semiconductor substrates, machining a first bore hole section in each of said substrate supports at least substantially perpendicular to the first surface side of the substrate carrier;

machining a second bore hole section from a wall surface circumferential of the substrate carrier extending radially through said substrate carrier for providing a gas connection between each of the first bore hole sections in the substrate supports and a center portion of the substrate carrier radially inward of the substrate supports;

press fitting a first bore hole plug part into the second bore hole section;

machining a pocket for a second bore hole plug part into the wall surface of the substrate carrier, wherein said pocket is provided with a thread and arranged at an angle with respect to a longitudinal direction of the bore hole;

screwing in a second bore hole plug part which is at least partially provided with a threaded section corresponding to said thread of said pocket, for blocking said first bore hole plug part.

14. The method of manufacturing a substrate carrier according to claim 13, wherein said method further, prior to said step of press fitting said first bore hole plug part, comprises the step of:

machining a chamfer on said wall surface of said substrate carrier.

15. The method of manufacturing a substrate carrier according to claim 13, wherein said second bore hole plug part comprises a polygon shaped tool receiving section extending from said head section and wherein said method further, after said step of screwing in said second bore hole plug part, comprises the step of:

machining said wall surface of said substrate carrier by removing said tool receiving section extending from said wall surface of said substrate carrier for making said second bore hole plug part flush with said wall surface of said substrate carrier.

16. The method of manufacturing a substrate carrier according to claim 13, wherein said method further, after said step of screwing in said second bore hole plug part, comprises the step of:

providing a coating of silicon carbide on at least said wall surface of said substrate carrier, and more in particular over covering all of said substrate carrier.

17. The method of manufacturing a substrate carrier according to claim 13, wherein one or both of said first and second bore hole plug parts is comprised of graphite.

* * * * *